(12) United States Patent
Wang et al.

(10) Patent No.: US 6,713,806 B2
(45) Date of Patent: Mar. 30, 2004

(54) METHOD FOR MANUFACTURING AN EXTENDED-WING CAPACITOR AND THE EXTENDED-WING CAPACITOR

(75) Inventors: Jong-Bor Wang, Hsinchu (TW); Chii-Ming Shiah, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/132,301

(22) Filed: Apr. 26, 2002

(65) Prior Publication Data

US 2003/0104701 A1 Jun. 5, 2003

(30) Foreign Application Priority Data

Dec. 5, 2001 (TW) ........................................ 90130070 A

(51) Int. Cl.[7] ..................... H01L 21/311; H01L 27/108; H01L 29/76; H01L 29/94; H01L 31/119
(52) U.S. Cl. ..................... 257/306; 257/301; 257/302; 257/303; 257/308; 257/309; 438/694
(58) Field of Search ................... 257/301, 302, 257/303, 306, 308, 309, 307; 438/694, 253, 254, 396, 37

(56) References Cited

U.S. PATENT DOCUMENTS 6,031,262 A  *  2/2000  Sakao .......................... 257/306
6,174,768 B1  *  1/2001  Takaishi ...................... 438/253

* cited by examiner

*Primary Examiner*—David Nelms
*Assistant Examiner*—Renee R Berry
(74) *Attorney, Agent, or Firm*—Fei-Fei Chao; Venable LLP

(57) ABSTRACT

This is related to a method for the manufacture of a capacitor with wing extensions and the capacitor device. The method comprises: (1) causing multiple contact areas to be disposed in alternate positions, such that two adjacent contact areas are complements of each other, (2) depositing electroplating base material (EBM) over the contact area, (3) electroplating a conductive material on the sidewalls of the EBM slab to form plate electrode; and then (4) etching back the EBM leaving only the electrode portion. The capacitor formed by the above method has a larger surface area on the electrode compared with that made by the conventional method, and the cell capacitance is also better. This method is especially effective for the manufacture of high-density memory device.

3 Claims, 11 Drawing Sheets

A-A

B-B

D-D

C-C

METHOD FOR MANUFACTURING AN EXTENDED-WING CAPACITOR AND THE EXTENDED-WING CAPACITOR

BACKGROUND OF THE INVENTION

1. Field of the Invention

The present invention relates to a method for manufacturing extended-wing capacitors, especially to the formation of high-density capacitors in tiny memory cells having high cell capacitance.

2. Description of Related Art

To manufacture advanced memory devices, the packing density of memory cells has to be increased multifold. This new design trend has had a tremendous impact on memory cell capacitors. Since the space for capacitors has to be smaller to fit in the new memory design, the capacitance of capacitors in memory cells is adversely affected. Therefore, a challenge in the process of manufacturing memory cells is how to maintain appropriate cell capacitance within the space constraint. The most difficult task is how to control the spacing between the plate electrodes, and the spacing between the insulating film and these two plate electrodes.

Among the efforts to maintain appropriate cell capacitance in high-density memory devices, the notion of a stacked capacitor (STC) structure is suggested. Since cylindrical or concave stacked capacitors are oval shaped, controlling the thickness of the high-k insulation film and the deposition of the top plate becomes very difficult when using these types of capacitors in tiny memory cells. The problem is especially severe when using materials such as BST, $SrTiO_3$ and PZT to form the high-k insulation film in cylindrical and concave stacked capacitors.

On the other hand, for convex stacked capacitors, the problem with spacing and deposition can be corrected considerably, but the surface area of the plate electrodes in convex stacked capacitors is even smaller. The resultant cell capacitance is only 0.6× that of cylindrical type capacitors.

To overcome the shortcomings in the prior art previously mentioned, a novel method for the manufacture of cell capacitors with wing extensions is devised.

SUMMARY OF THE INVENTION

The main objective of the present invention is to provide a method for manufacturing extended-wing capacitors in memory cells. The arrangement of contact areas is such that two adjacent contact areas are in alternating positions, rather than being juxtaposed as in the prior art. The wing-like plate electrode is formed over a contact area, vertically over the contact area and extending laterally towards a neighboring contact area. This type of plate electrode with a wing extension is capable of improving the cell capacitance, because the effective surface area of the plate is increased by a significant amount.

Another objective of the present invention is to use generally applied conventional techniques such as photo etching, etching, and deposition to carry out the method for manufacturing extended-wing capacitors in memory cells. Use of generally applied, conventional techniques will ensure that the manufacturing process can be well controlled and the manufacturing yield can be maintained at high levels.

The method for the manufacture of extended-wing capacitors in memory cells comprises the steps of:

(1) forming multiple contact areas to be disposed in alternate positions;

(2) depositing electroplating base material (EBM) over the substrate including the alternate contact areas, patterned to form transversal parallel slabs;

(3) covering the EBM layer with insulating film, patterned to form longitudinal parallel lines, such that the insulating lines and EBM slabs together form a crisscross pattern, separating the EBM slabs into multiple segments;

(4) electroplating conductive material on the exposed area of EBM to form an electrode layer; and (5) removing the insulating film and EBM, thus a plate electrode is formed over a contact area.

The design of this capacitor is such that the plate electrode is formed vertically over each contact area and two adjacent contact areas are disposed in alternate positions to accommodate the lateral wing extension of the plate electrode. Under such design, the surface area of a plate electrode can be increased by large proportions. Therefore, using this method high-density memory device can be manufactured with high cell capacitance. Since the plate electrode is formed by conventional electroplating, the manufacturing process can be well controlled, allowing the manufacturing yield to be maintained at high levels even for tiny memory cells with very small space.

DETAILED DESCRIPTION OF THE PREFERRED EMBODIMENT

Figure 1:
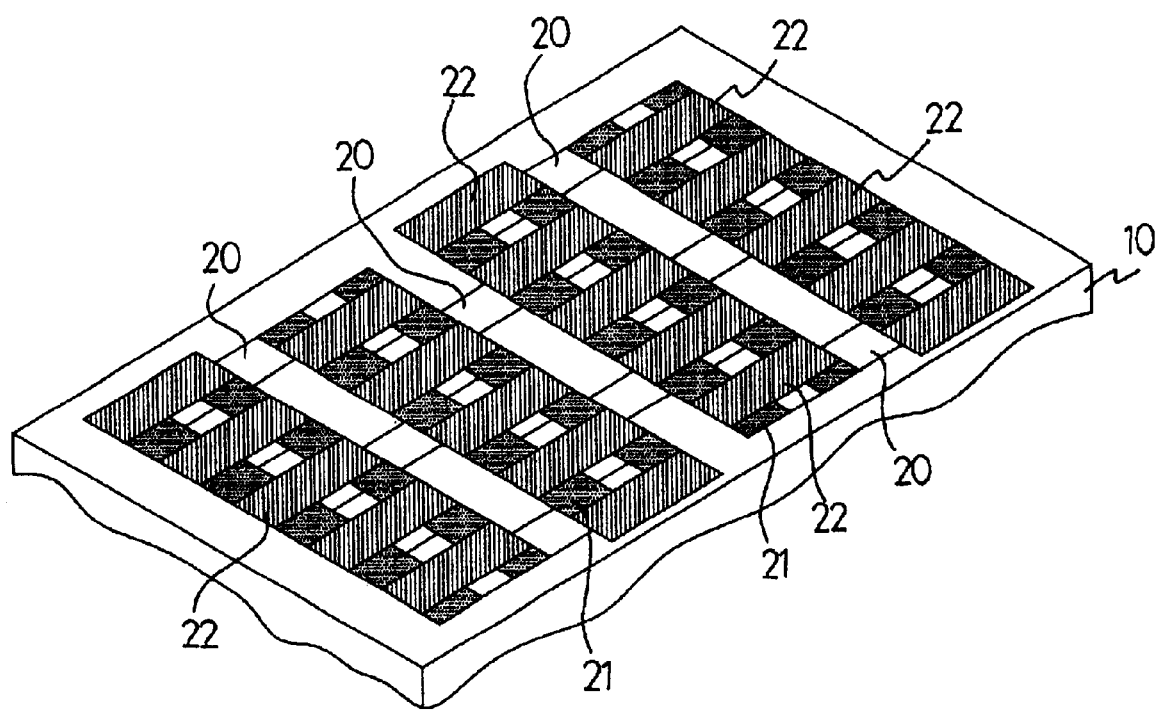
FIG. 1 is a perspective view of the alternating contact areas formed on a memory substrate in accordance with the present invention.

The precondition to the present invention is that multiple longitudinal interleaved word lines (21) and alternately spaced active areas (20) are formed on a memory substrate (10). Each active area (20) is located next to a contact area (22) and vice versa, and each longitudinal word line crosses over a column of contact areas (22) on ends, as shown in FIG. 1. These word lines (21) and active areas (20) can be formed with the conventional methods for fabricating memory devices, whereas the contact area (22) is to be described in the implementation procedures for the present invention.

Figure 2:
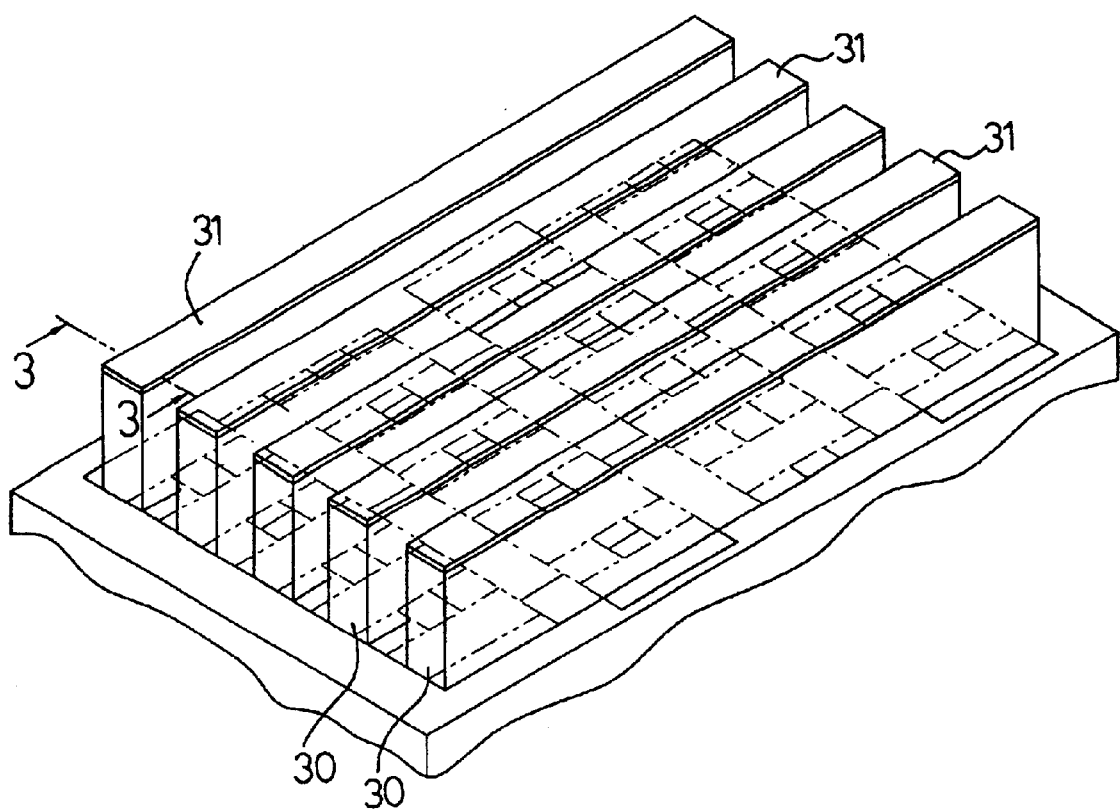
FIG. 2 is a perspective view of the electroplating base material (EBM) deposited over the alternating contact areas in accordance with the present invention.
Figure 3:
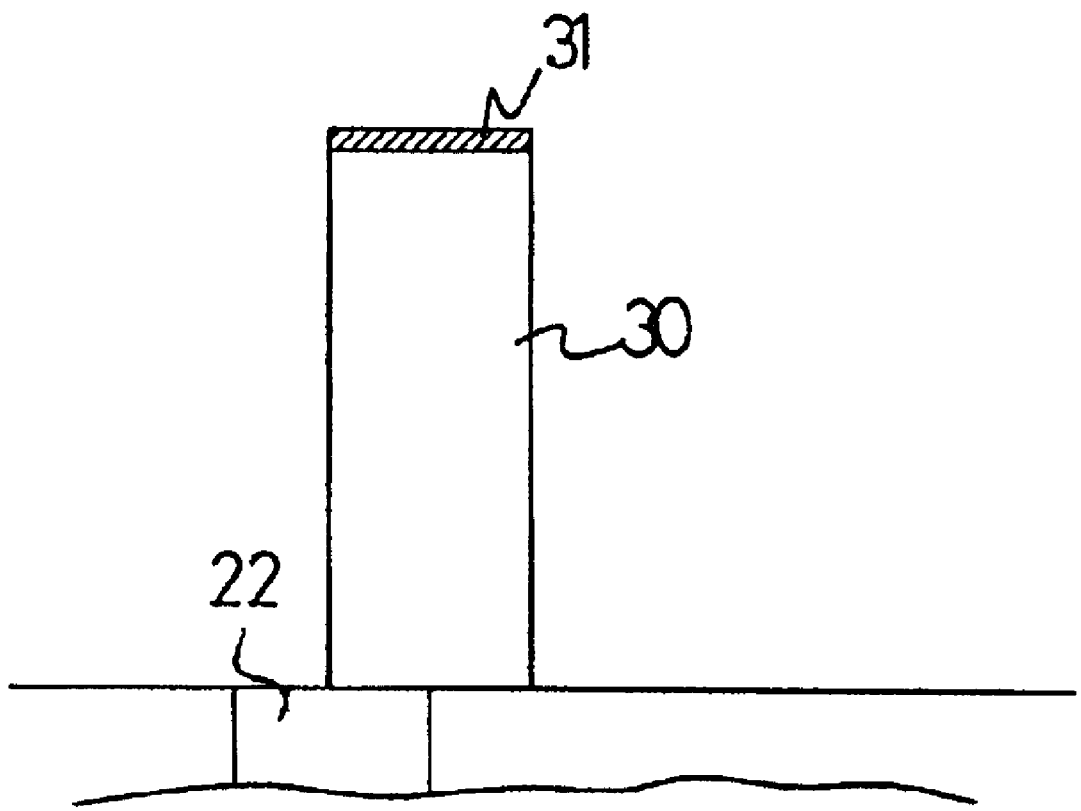
FIG. 3 is a partial cross sectional side plan view along line 3—3 in FIG. 2.

With reference to FIGS. 1, 2 and 3, the steps for manufacturing an extended-wing capacitor comprise:

(1) forming multiple contact areas (22) on the memory substrate (10) in alternate positions, between pairs of word lines (21). These contact areas are in column formation, like the active areas (20). Elements in the same column are alternately spaced, and elements in adjacent columns are the complements of each other; wherein contact areas are formed through the steps of (1) forming multiple contact holes on the memory substrate, each surrounded by the isolation layer, such as Silicon Nitride (SiN);

(2) depositing the contact hole with conductive material (such as Polysilicon, Platinum, and Ruthenium); and (3) polishing the contact surface by Chemical Mechanical Polishing (CMP) to form the contact areas.

Figure 4:
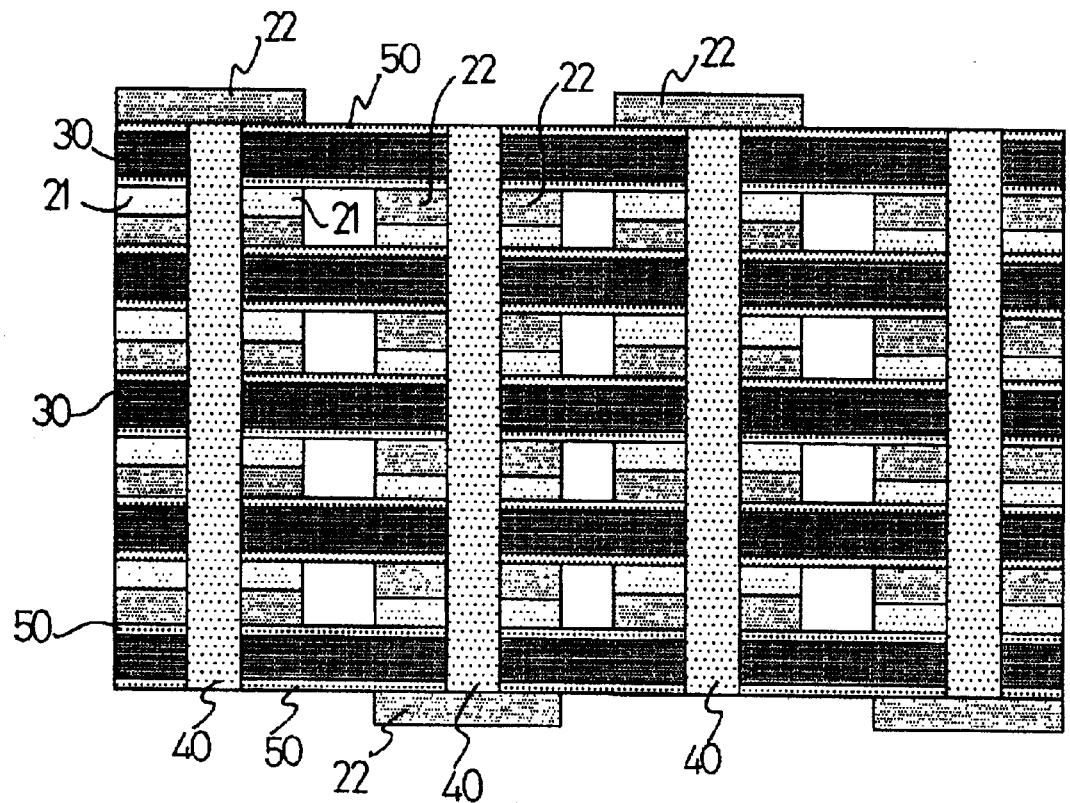
FIG. 4 is a top plan view of the first embodiment of the present invention showing single spacing electroplated coating for capacitor electrodes on the sidewalls of each EBM slab and the insulating line crossing over the EBM slab and the center portion of each adjacent contact area.
Figure 5:
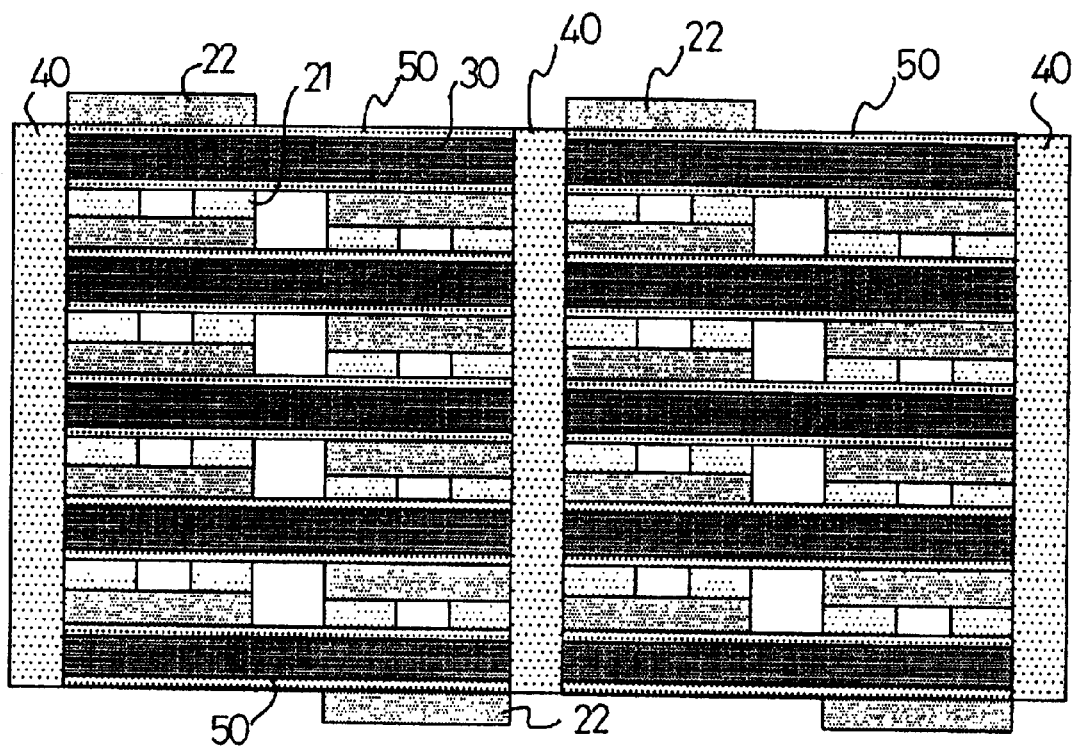
FIG. 5 is a top plan view of the second embodiment showing the double spacing electroplated coating for capacitor electrodes on the sidewalls of EBM and the insulating line crossing over the EBM slab, covering every other adjacent active area and between pairs of contact areas.
Figure 6:
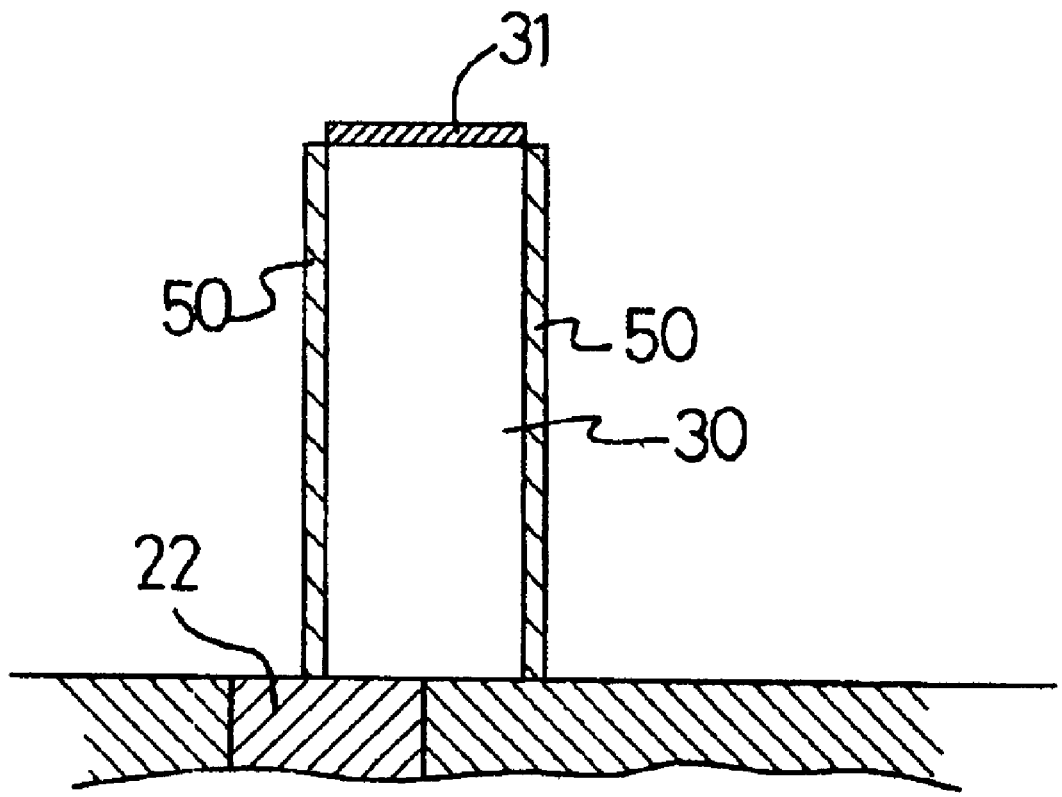
FIG. 6 is a partial cross sectional side plan view of the electroplated coating for a capacitor electrode on the sidewalls of EBM in accordance with the present invention.

(1) depositing electroplating base material (EBM) (30) on the entire substrate including the contact areas (22), using materials such as TiN, W/TiN, whereby the thickness of the EBM slab (30) represents the height of the plate electrode;

(2) capping the EBM (30) with an oxide layer (31) by deposition method;

(3) selectively etching back the oxide layer (31) by means of photo etching using a photoresistor pattern as a mask to form multiple transversal parallel slabs, whereby the contact area (22) and the word line (21) crossed by a EBM slab are partially covered by EBM deposit (30), as shown in FIG. 2, and the oxide layer (31) remaining on top of the EBM slab (FIG. 3) is for insulation during electroplating;

(4) covering the EBM (30) with insulating film (40), which can be a photo resistor patterned to form multiple longitudinally parallel lines, aligned with the center portion of the contact areas (22) and dividing each contact area (22) into two sections as in the first embodiment of the present invention shown in FIG. 4; or else, the insulating line is to cover every other adjacent active area and between pairs of adjacent contact areas as in the second embodiment shown in FIG. 5. The insulating lines (40) placed in longitudinal direction in both cases cross over the EBM (30) to form a crisscross pattern;

(5) electroplating conducting material such as Platinum on the exposed area of EBM slab (30) to form an electrode layer (50), that is the sidewalls of the EBM slab (30) not covered by the insulating film (40) or oxide layer (31), referring to the cutaway view of the EBM slab in FIG. 6; and (6) removing the insulating film (40) and the EBM (30) by means of ion etching or wet etching.

Figure 8:
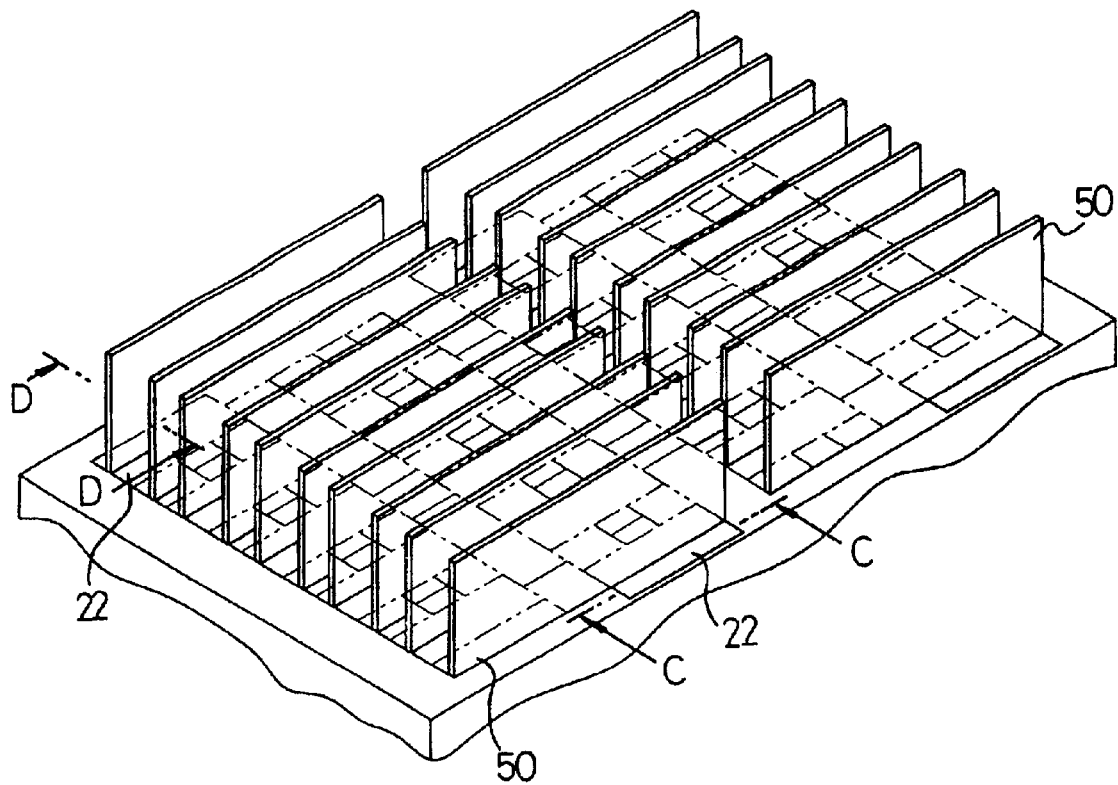
FIG. 8 is a perspective view of the plate electrodes of the second embodiment after the removal of the insulating film and EBM previously shown in FIG. 5.

After the removal of the insulating film (40) and EBM slab (30) previously shown in FIG. 4, a plate electrode (50) is formed vertically over a contact area (22). With reference to FIG. 8, the plate electrode structure is formed after removal of insulating film (40) and EBM (30) previously shown in FIG. 5.

Figure 7:
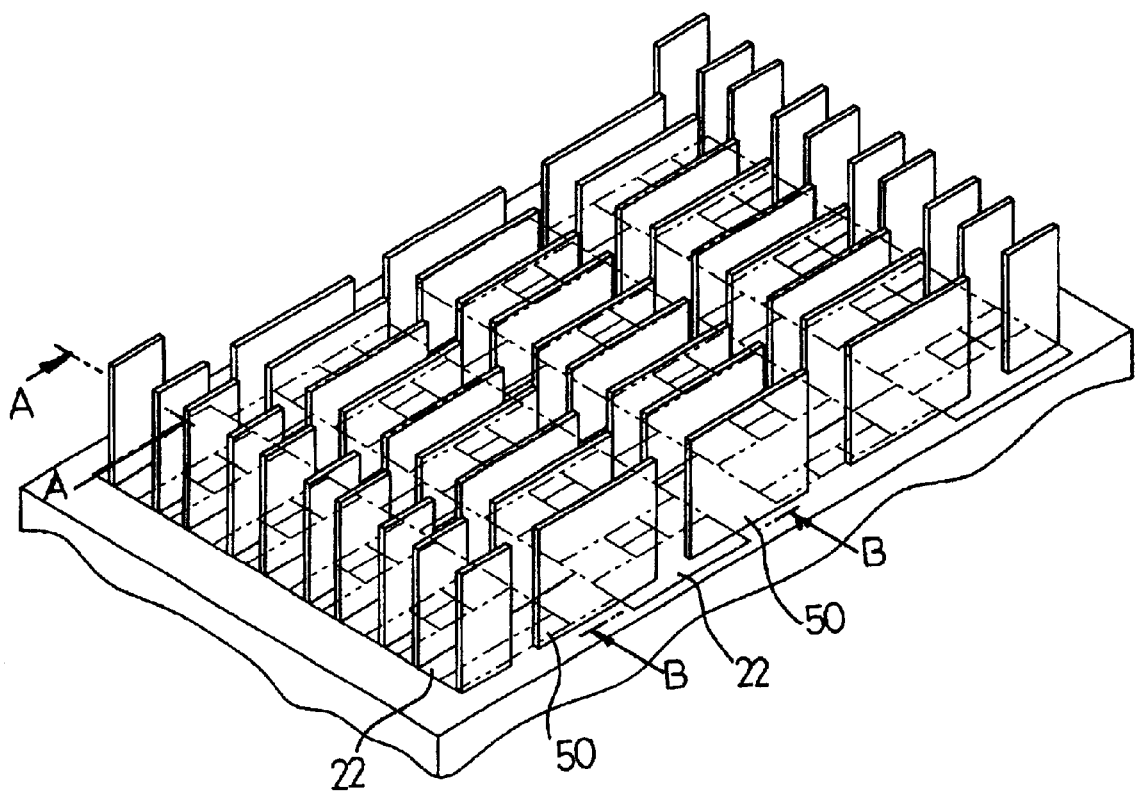
FIG. 7 is a perspective view of the plate electrodes of the first embodiment after removal of the insulating film and EBM previously shown in FIG. 4.
Figure 9:
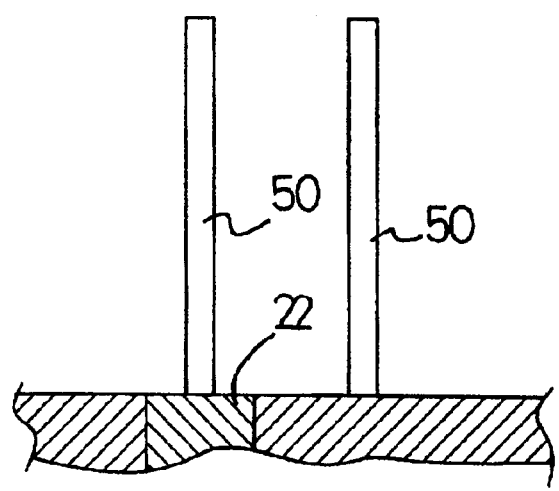
FIG. 9 is a cross sectional side plan view along line A—A in FIG. 7 showing two consecutive plate electrodes in the same column.
Figure 10:
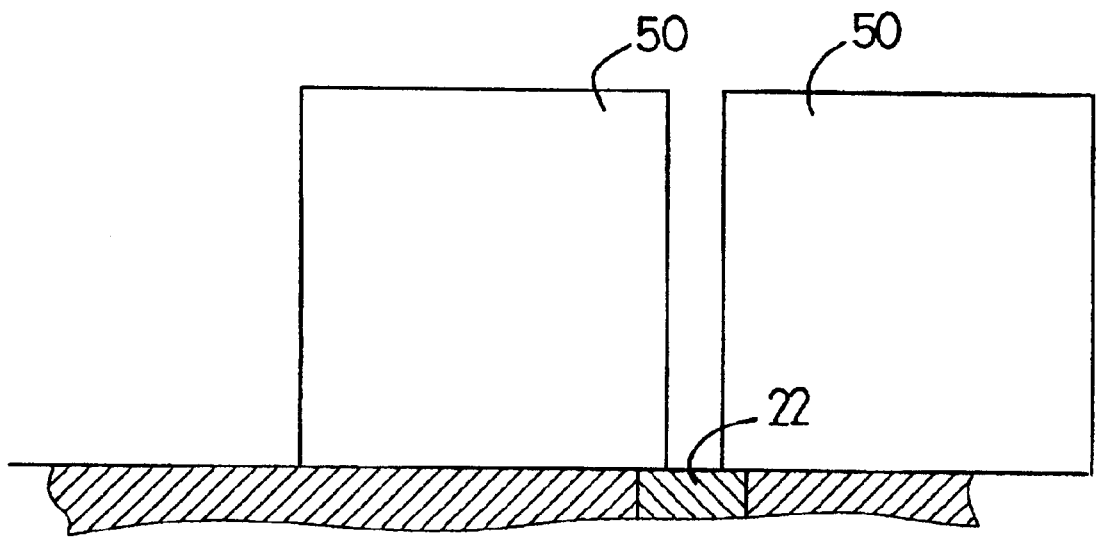
FIG. 10 is a cross sectional front plan view along line B—B in FIG. 7 showing two adjacent plate electrodes over a common contact area.

With reference to FIG. 9, the cutaway diagram along line A—A taken out from FIG. 7, the bottom of two consecutive plate electrodes (50) in a column is each connected to a contact area (22). With reference to FIG. 10, the cutaway diagram along line B—B taken out from FIG. 7, the bottom of two plate electrodes on adjacent columns is in contact with a common contact area (22) and symmetrical plate electrodes are formed on both sides of the contact area (22).

Figure 12:
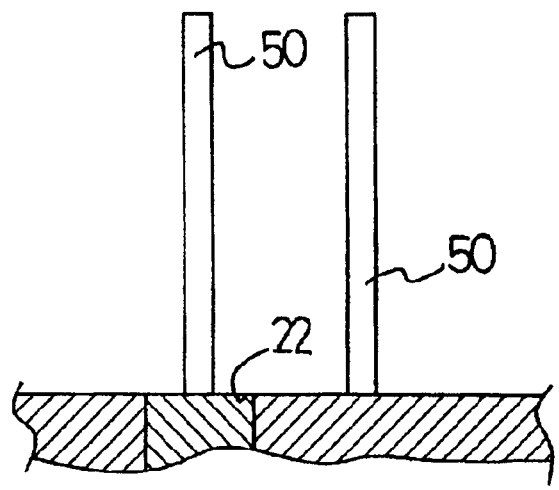
FIG. 12 is a cross sectional view taken from line D—D in FIG. 8 showing the bottom of two consecutive plate electrodes in the same column connected by a contact area.
Figure 11:
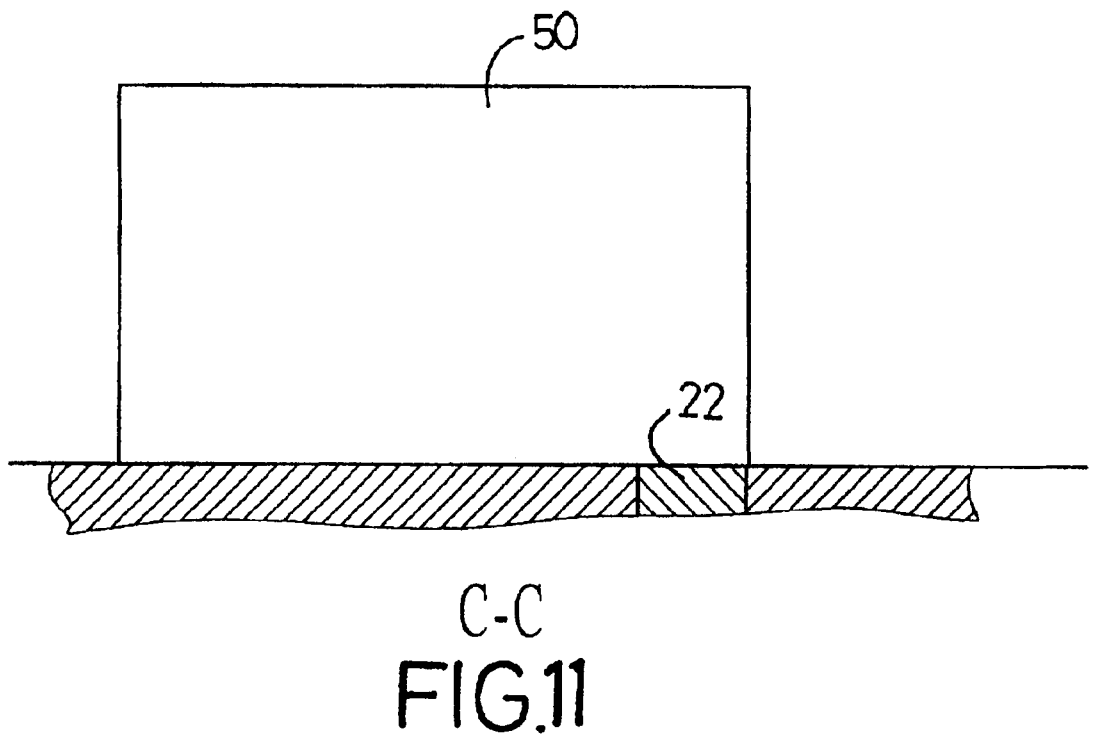
FIG. 11 is a cross sectional front plan view along line C—C in FIG. 8 showing the bottom of a plate electrode over contact areas on ends.

With reference to FIG. 11, the cutaway diagram along line C—C taken out from FIG. 8, the bottom of a double spacing plate electrodes (50) is connected to a contact area (22) on one end. With reference to FIG. 12, the cutaway diagram along line D—D taken out from FIG. 8, the bottom of two consecutive double spacing plate electrode (50) is each connected to a contact area (22).

Figure 13:
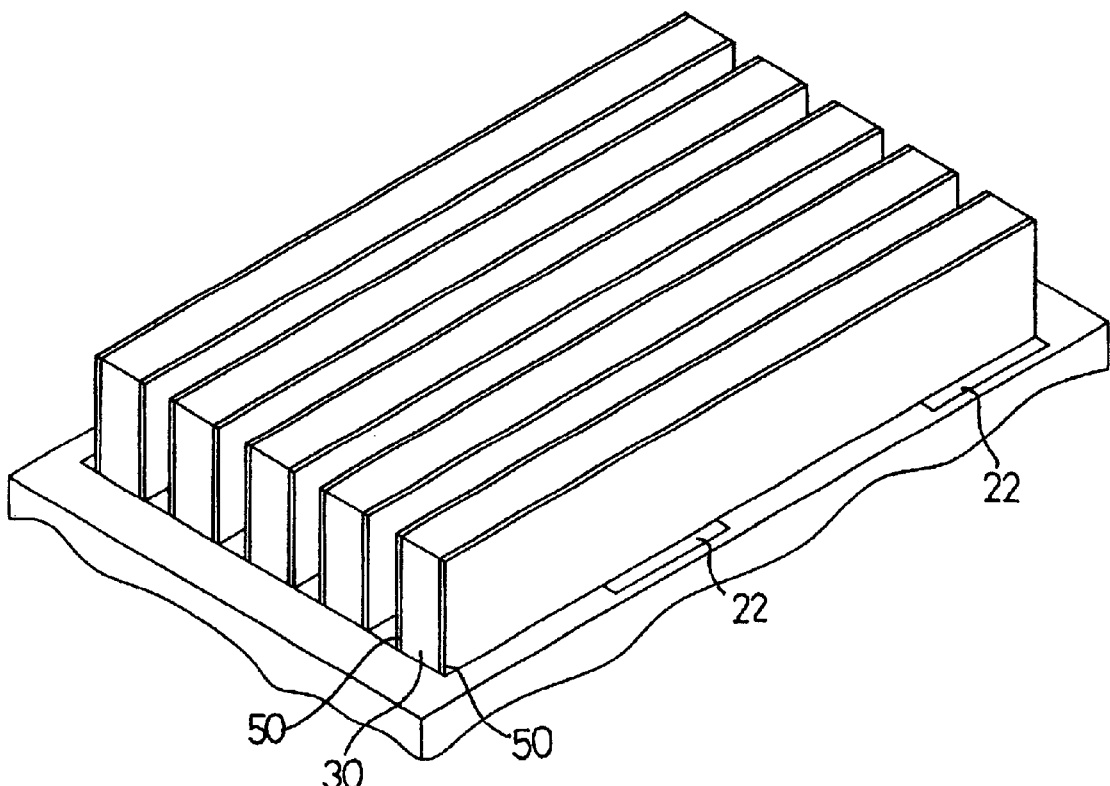
FIG. 13 is a perspective view of the present invention by first electroplating the entire EBM slab and then etching back the top portion leaving the portion on the EBM sidewalls for plate electrodes.
Figure 14:
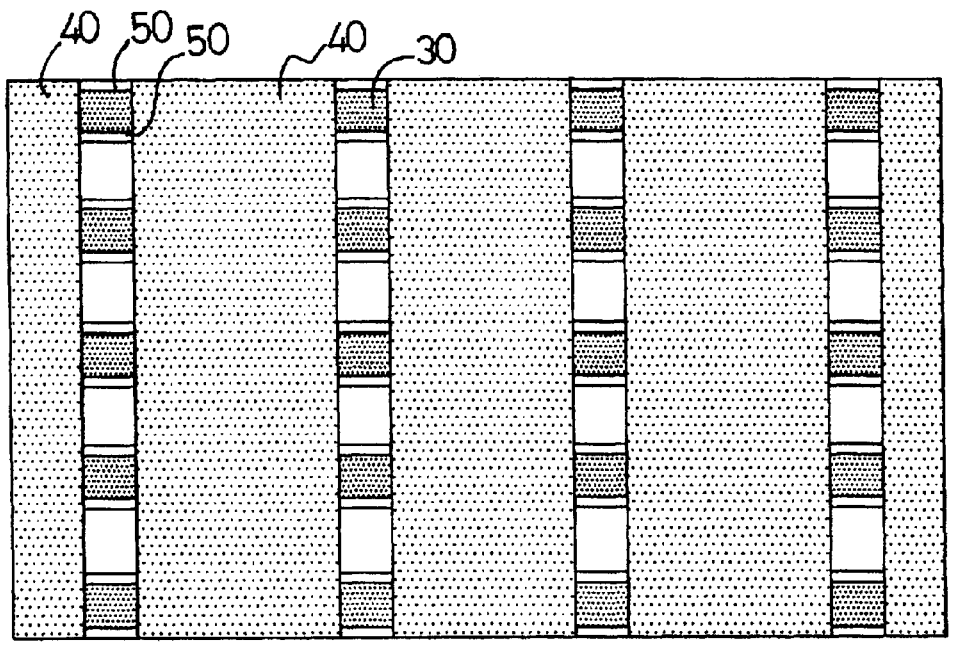
FIG. 14 is a top plan view of the third embodiment showing the insulating film over single spacing plate electrodes previously shown in FIG. 13.
Figure 15:
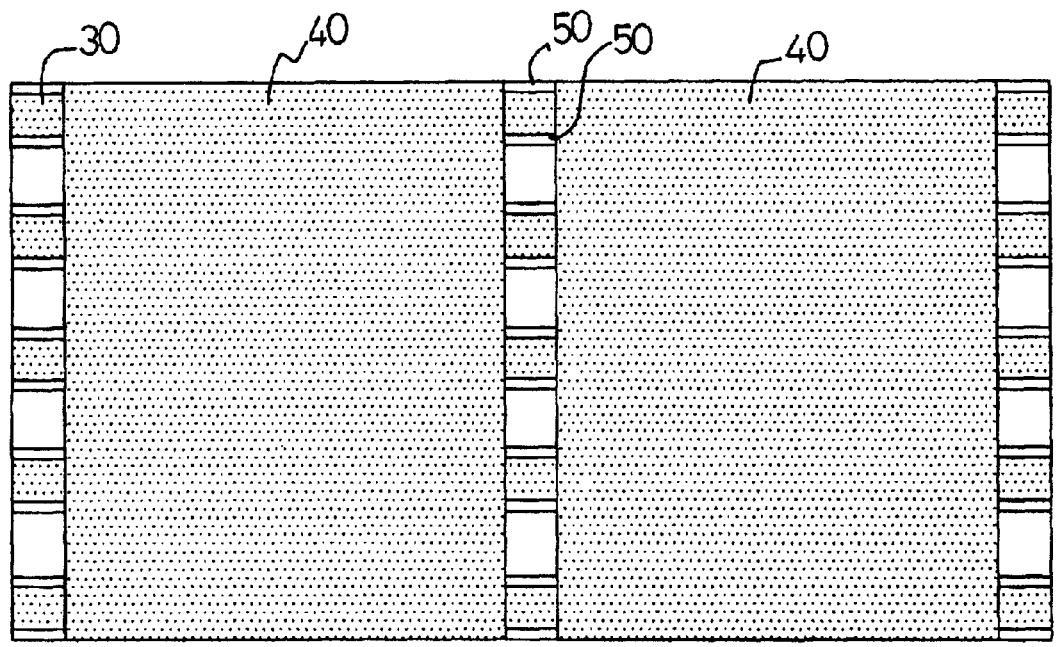
FIG. 15 is a top plan view of the fourth embodiment showing the insulating film over double spacing plate electrodes previously shown in FIG. 13.

The procedures mentioned above represent two actual embodiments of the present invention for the manufacture of a plate electrode. However, the present invention can be implemented with an alternative method to be described below:

In the following embodiments, like the case presented in FIG. 2, the sequence of steps for manufacturing the plate electrode includes:

(1) depositing the EBM (30) layer and then etching back to form multiple parallel EBM slabs;

(2) depositing the entire EBM slab with conductive material including the top and both sidewalls (30) with conductive material such as Platinum to form an electrode layer (50);

(3) etching back from the top of the EBM (30) by dry etching, leaving metal portion on the sidewalls of the EBM, thus forming multiple parallel slabs with sidewalls coated in conductive material, as shown in FIG. 13;

(4) crossing over the EBM (30) and the deposited plate electrode (50)with insulating film (40) patterned to form multiple parallel bands to partially cover pairs of adjacent contact areas (22) on opposite ends and an active area in between as in the third embodiment shown in FIG. 14; or else, the EBM bands are to entirely cover pairs of adjacent contact areas and an active area in between, separating the first pair of adjacent contact areas from the second pair of two adjacent contact areas as in the fourth embodiment shown in FIG. 15; and (5) etching back the area of plate electrode slab (50), that is the area not covered by the insulating film (40) using wet etching, and (6) removing the EBM portion (30) and the insulating film (40) on top, thus completing a plate electrode (50) as shown in FIGS. 7 and 8.

The method for manufacturing plate electrode as proposed in the present invention has made considerable improvements by enhancing the functionality of conventional capacitors. The foregoing illustration of the preferred embodiments in the present invention is intended to be illustrative only; that many changes and modifications may be made without departing from the scope of the invention as defined in the claims.

What is claimed is:

1. An extended-wing cell capacitor in memory cells, comprising:

a memory substrate on which multiple columns of contact areas are formed, wherein the contact areas of one column are alternately formed relative to the contact areas of an adjacent column;

multiple plate electrodes vertically formed over the contact areas and extending laterally toward a neighboring contact area.

2. The extended-wing capacitor device in memory cells as claimed in claim 1, wherein a pair of plate electrodes formed over each of the multiple contact areas is extending laterally in symmetry, and spaced from the adjacent contact areas.

3. The extended-wing capacitor device in memory cells as claimed in claim 1, wherein each contact area has only one plate electrode formed thereon, the only one plate electrode extending laterally in a single direction and spaced from the adjacent contact areas.

* * * * *